(12) United States Patent
Koyama et al.

(10) Patent No.: US 7,943,478 B2
(45) Date of Patent: May 17, 2011

(54) SEMICONDUCTOR DEVICE MANUFACTURING METHOD

(75) Inventors: Haruhiko Koyama, Yokohama (JP);
Mitsuhiro Noguchi, Yokohama (JP);
Minori Kajimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/541,457

(22) Filed: Aug. 14, 2009

(65) Prior Publication Data
US 2009/0298254 A1    Dec. 3, 2009

Related U.S. Application Data

(63) Continuation of application No. 11/536,291, filed on Sep. 28, 2006, now Pat. No. 7,585,742.

(30) Foreign Application Priority Data

Sep. 30, 2005   (JP) .................................. 2005-288567

(51) Int. Cl.
*H01L 21/76*   (2006.01)
(52) U.S. Cl. ................. 438/401; 438/975; 257/E23.179
(58) Field of Classification Search .................. 438/401, 438/975, 942–950; 257/797, E23.179
See application file for complete search history.

(56) References Cited

U.S. PATENT DOCUMENTS

| | | | |
|---|---|---|---|
| 6,368,936 B1 | 4/2002 | Yoshida | |
| 2003/0127671 A1* | 7/2003 | Kim | 257/290 |
| 2006/0057815 A1* | 3/2006 | Kim | 438/401 |
| 2006/0091470 A1 | 5/2006 | Noguchi et al. | |
| 2006/0205139 A1* | 9/2006 | Kijima et al. | 438/232 |
| 2007/0037359 A1* | 2/2007 | Jo | 438/401 |
| 2007/0187797 A1 | 8/2007 | Kato et al. | |

FOREIGN PATENT DOCUMENTS

| | | |
|---|---|---|
| JP | 62-61353 | 3/1987 |
| JP | 62-211957 | 9/1987 |
| JP | 64-4019 | 1/1989 |
| JP | 5-160355 | 6/1993 |
| JP | 7-147221 | 6/1995 |
| JP | 2000-114397 | 4/2000 |
| JP | 2000-156506 | 6/2000 |
| JP | 2001-68543 | 3/2001 |
| JP | 2002-9173 | 1/2002 |

OTHER PUBLICATIONS

Office Action issued Nov. 24, 2010 in Japanese Patent Application No. 2005-288567 filed Sep. 30, 2005 (w/English language translation).

* cited by examiner

*Primary Examiner* — Michael S Lebentritt
*Assistant Examiner* — Daniel Whalen
(74) *Attorney, Agent, or Firm* — Oblon, Spivak, McClelland, Maier & Neustadt, L.L.P.

(57) ABSTRACT

In a semiconductor device manufacturing method, a surface of a substrate structure including a semiconductor layer is covered with a first film including first and second openings. The first opening is configured as an alignment mark. The second opening is configured as an opening for introducing an impurity into a first predetermined position of the semiconductor layer. In this method, a third opening is formed in the first film, using a photo mask aligned with the first opening used as an alignment mark. The third opening is configured as an opening for introducing an impurity into a second predetermined position of the semiconductor layer.

9 Claims, 9 Drawing Sheets

SEMICONDUCTOR DEVICE MANUFACTURING METHOD

CROSS-REFERENCE TO RELATED APPLICATIONS

This application is a continuation of and claims the benefit of priority under 35 U.S.C. §120 from U.S. Ser. No. 11/536,291 filed Sep. 28, 2006, and claims the benefit of priority under 35 U.S.C. §119 from Japanese Patent Application No. 2005-288567 filed Sep. 30, 2005, the entire contents of each of which are incorporated herein by reference.

BACKGROUND OF THE INVENTION

1. Field of the Invention

The present invention relates to a semiconductor device manufacturing method and a semiconductor device, and particularly to an alignment technique used for photolithography steps.

2. Description of the Related Art

Photolithography techniques are utilized in manufacturing semiconductor integration circuit devices. In the techniques of this kind, a selected portion of a photo-resist film is subjected to light exposure to form a certain pattern. The photo-resist film with the certain pattern thus formed is used as a barrier wall (mask) in etching an insulative film or conductive film, or a barrier wall (mask) in ion-implanting an impurity. When light exposure is performed on the photo-resist film, a photo mask is used. The photo mask has a certain pattern drawn thereon, which is to be transferred onto the photo-resist film. When the transfer is performed, it is important to accurately align the photo mask with a predetermined position. For this purpose, an alignment mark is formed on a wafer or chip. For example, a light exposure apparatus detects the alignment mark, and thereby aligns the photo mask with a predetermined position. Alignment marks of this kind are disclosed in, e.g., Jpn. Pat. Appln. KOKAI Publication No. 7-147221 (Patent Document 1). Incidentally, hereinafter, a processing step utilizing a photolithography technique is referred to as a PEP or PEP step, as needed.

Next, manufacture of a Flash EEPROM of the NAND type will be explained as a specific example of manufacture of a semiconductor integration circuit device. In the case of a Flash EEPROM of the NAND type, well formation steps and channel ion implantation steps (the latter steps are used each for introducing an impurity for adjusting a threshold voltage) are performed before a floating gate formation step. This is disclosed in, e.g., Jpn. Pat. Appln. KOKAI Publication No. 2002-9173 (Patent Document 2). Thus, the well formation steps are performed inevitably before a step of forming a device isolation area to define active areas (which will be referred to as an STI (shallow trench isolation) step for example, hereinafter). In the well formation steps, different impurities are implanted into respective predetermined portions, as required. Accordingly, PEPs are respectively performed in a plurality of steps. Since the PEPs are performed like this, it is necessary to prevent the layers formed by the respective PEPs (each of which will be referred to as a PEP layer) from causing misalignment with each other. For this purpose, a step of forming only an alignment mark is performed before the well formation steps. This alignment mark is sometimes called a ZL mark, and the step of forming only an alignment mark is sometimes abbreviated as a ZL step.

Since each well formation step is arranged to merely implant an impurity into a semiconductor substrate, it leaves no clear mark on the substrate surface. Accordingly, an alignment mark (ZL mark) is formed to be utilized in subsequent PEP steps. For example, the ZL step is performed as a first PEP step to form only an alignment mark on a substrate surface, such as a wafer surface or chip surface. Then, each of the PEPs for the well formation steps is performed while using a photo mask aligned with the alignment mark thus formed. The PEP for the STI step is also performed while using a photo mask aligned with the alignment mark thus formed.

However, this manufacturing technique performs a PEP step only for formation of an alignment mark. The alignment mark has nothing to do with the device operation. Further, the PEP step is relatively expensive among the processing steps for an integration circuit. Thus, the PEP step only for formation of an alignment mark increases the manufacturing cost.

Further, each of the PEPs for the well formation steps is performed while using a photo mask aligned with the alignment mark. Accordingly, the alignment between the wells is indirect alignment. The PEP for the STI step is also performed in the same manner, and thus the alignment between the wells and STI is also indirect alignment. This problem makes it difficult to decrease the size of chips.

BRIEF SUMMARY OF THE INVENTION

According to a first aspect of the present invention, there is provided a semiconductor device manufacturing method comprising: covering a surface of a substrate structure including a semiconductor layer with a first film including first and second openings, the first opening being configured as an alignment mark, and the second opening being configured as an opening for introducing an impurity into a first predetermined position of the semiconductor layer; introducing a first impurity into the semiconductor layer through the second opening; forming a third opening in the first film while using a photo mask aligned with the first opening used as an alignment mark, the third opening being configured as an opening for introducing an impurity into a second predetermined position of the semiconductor layer; and introducing a second impurity into the semiconductor layer through the third opening.

According to a second aspect of the present invention, there is provided a semiconductor device manufacturing method comprising: covering a surface of a substrate structure including a semiconductor layer with a first film including first and second openings, the first opening being configured as an alignment mark, and the second opening being configured as an opening for introducing an impurity into a first predetermined position of the semiconductor layer; introducing a first impurity into the semiconductor layer through the second opening; covering a surface of the first film including the first and second openings with a second film; forming a third opening in the second film while using a photo mask aligned with the first opening used as an alignment mark, the third opening being configured as an opening for introducing an impurity into a second predetermined position of the semiconductor layer; and introducing a second impurity into the semiconductor layer through the third opening.

According to a third aspect of the present invention, there is provided a semiconductor device comprising: a semiconductor substrate; a first well disposed in the semiconductor substrate and doped with a first impurity; a second well disposed in the semiconductor substrate and doped with a second impurity; a trench left in the semiconductor substrate as a trace of a photolithography alignment mark; and a region disposed in the semiconductor substrate below the trench and doped with the first and second impurities.

According to a fourth aspect of the present invention, there is provided a semiconductor device comprising: a semiconductor substrate; a channel region disposed in the semiconductor substrate and doped with a first impurity for adjusting a threshold voltage; a first well disposed in the semiconductor substrate and doped with a second impurity; a first region disposed in the semiconductor substrate as a trace of a first photolithography alignment mark and doped with the first impurity; a trench left in the semiconductor substrate as a trace of a second photolithography alignment mark; and a region disposed in the semiconductor substrate below the trench and doped with the second impurity.

DETAILED DESCRIPTION OF THE INVENTION

Embodiments of the present invention will now be described with reference to the accompanying drawings. In the following description, the constituent elements having substantially the same function and arrangement are denoted by the same reference numerals, and a repetitive description will be made only when necessary.

First Embodiment

Figure 1:
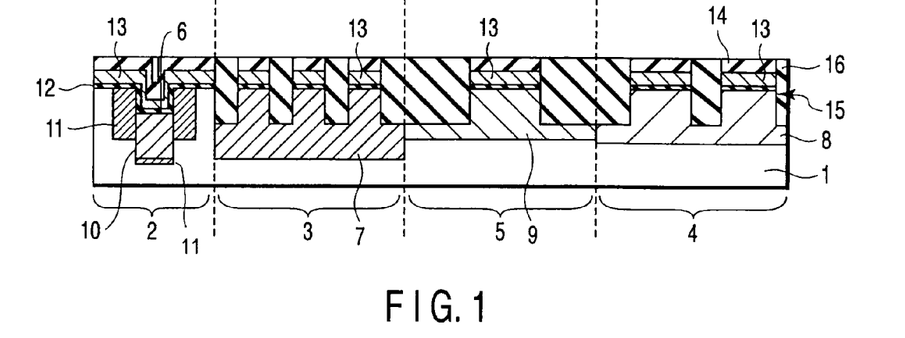
FIG. 1 is a sectional view showing a sectional structure of a semiconductor integration circuit device according to a first embodiment of the present invention, immediately after STI formation.

FIG. 1 is a sectional view showing a sectional structure of a semiconductor integration circuit device, such as a Flash EEPROM of the NAND type, according to a first embodiment of the present invention, immediately after device isolation area (which will be referred to as an STI, for example, hereinafter) formation.

A semiconductor substrate, such as a silicon substrate 1, has a plurality of well formation areas defined therein, which are used for forming circuits of different types in the substrate 1. For example, in the case of a Flash EEPROM of the NAND type, the substrate 1 has areas for disposing a memory cell array, and a peripheral circuit, a booster circuit, and a high breakdown-voltage circuit (such as, an isolation transistor) around the array. In the example shown in FIG. 1, the substrate 1 has a first well formation area 3, a second well formation area 4, and a third well formation area 5. The well formation areas 3, 4, and 5 have a first well 7, a second well 8, and a third well 9, respectively, formed in their surfaces.

In addition to the well formation areas 3, 4, and 5, the substrate 1 has an alignment mark formation area 2, which is used for forming an alignment mark on or in the substrate 1. A first trench 6 is formed in the mark formation area 2. At the bottom of the first trench 6, there is an impurity diffusion layer 10 doped with an impurity for forming the first well 7 and an impurity for forming the second well 8. Further, around the bottom of the first trench 6, there is an impurity diffusion layer 11 doped with the impurity for forming the second well 8.

A gate oxide film 12 having a thickness of, e.g., about 7 nm is disposed on the surface of the substrate 1. A conductive silicon film 13 having a thickness of, e.g., about 150 nm is disposed on the gate oxide film 12. For example, the conductive silicon film 13 is used as the floating gate electrodes (which will be referred to as FG, hereinafter) of memory cells in a memory cell array, and the gate electrodes of transistors in a peripheral circuit. A silicon nitride film 14 is disposed on the conductive poly-crystalline silicon film 13. The silicon nitride film 14 is used as a stopper for a silicon oxide film when performing a CMP to form the device isolation area. Second trenches 15 for device isolation are formed in the silicon nitride film 14, conductive poly-crystalline silicon film 13, and substrate 1. The second trenches 15 are filled with a silicon oxide film 16 to form STI.

FIGS. 2 to 7 are sectional views showing steps, in order, of an exemplary method of manufacturing the device according to the first embodiment of the present invention.

Figure 2:
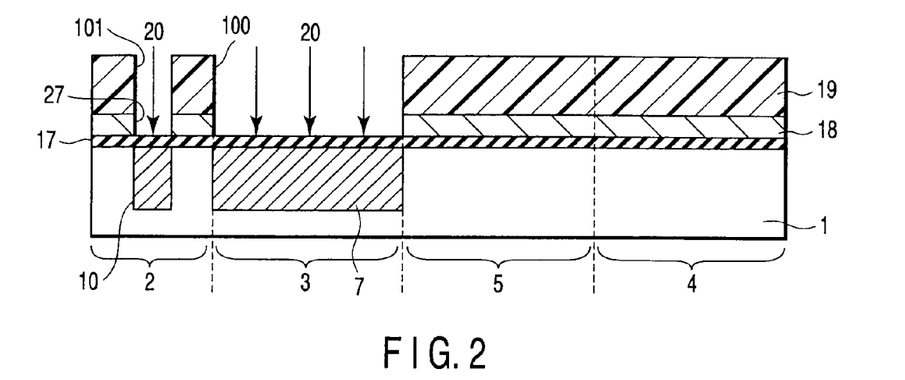
FIGS. 2, 3, 4, 5, 6, and 7 are sectional views showing steps, in order, of an exemplary method of manufacturing the device according to the first embodiment of the present invention.

As shown in FIG. 2, the surface of a silicon substrate 1 is oxidized by, e.g., a thermal oxidation method to form a silicon oxide film 17 (which will be referred to as a pad oxide film, hereinafter) having a thickness of, e.g., about 10 nm on the silicon substrate 1. Then, poly-crystalline silicon is deposited by a CVD method to form a dummy poly-crystalline silicon film 18 having a thickness of, e.g., about 50 nm on the pad oxide film 17. Then, a photo-resist is applied onto the substrate 1 to form a photo-resist film 19. Then, an opening portion 100 is formed in the photo-resist film 19 by a photolithography method, at a position corresponding to a first well formation area 3. The opening portion 100 is used as a window to introduce an impurity for forming a first well. At this time, an opening portion 101 is further formed in the photo-resist film 19 at a position corresponding to an alignment mark formation area. The opening portion 101 is used for forming a mark in the dummy poly-crystalline silicon film 18, which is usable as an alignment mark.

Accordingly, the mask pattern drawn on the photo mask used at this time, which is transferred onto the photo-resist film 19, includes both a first well formation pattern and an alignment mark formation pattern. This PEP is the first PEP, and thus there is no need to read an alignment mark, because no alignment mark is present on the underlayer, such as the substrate (wafer) 1, at this time. For example, the light exposure for respective chips on the substrate (wafer) can be performed at a predetermined step pitch of a light exposure apparatus. Accordingly, for example, rough alignment can be used.

Then, the dummy poly-crystalline silicon film 18 is etched by an RIE method, such that this etching stops at the surface of the pad oxide film 17. During this etching, a step or opening 27 is formed in a portion of the dummy poly-crystalline silicon film 18 within the alignment mark formation area 2.

The opening 27 is usable as an alignment mark. Then, using the photo-resist film 19 as a mask, an impurity 20, such as boron, is ion-implanted. Consequently, a first well 7 is formed in the substrate 1 at a position corresponding to the first well formation area 3. Further, a diffusion layer 10 is formed in the substrate 1 at a position corresponding to the alignment mark formation area 2.

Figure 3:
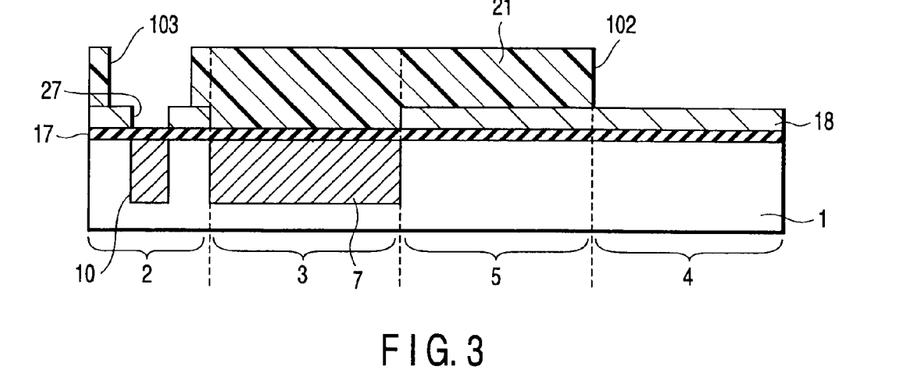

Then, as shown in FIG. 3, ashing of the photo-resist film 19 is performed, such that it is peeled off by, e.g., a mixture solution of sulfuric acid with hydrogen peroxide solution. An HF based chemical agent may be used, as needed. This matter is common to subsequent peel-off steps for photo-resist films. Then, a photo-resist is applied onto the substrate 1 to form a photo-resist film 21. Then, an opening portion 102 is formed in the photo-resist film 21 by a photolithography method, at a position corresponding to a second well formation area 4. The opening portion 102 is used as a window to introduce an impurity for forming a second well. At this time, the opening 27 formed in the dummy poly-crystalline silicon film 18 is used as an alignment mark. For example, a light exposure apparatus detects the opening 27, and thereby aligns the photo mask for forming the opening portion 102 with a predetermined position. For example, this corresponds to a fine alignment performed after a rough alignment.

Since the opening 27 and the opening portion 102 for the first well 7 are formed by the same PEP, the opening 27 and first well 7 are defined by a common PEP layer. Consequently, when the PEP layer defining the second well 8 is formed, using the opening 27 as an alignment mark, it is directly aligned with the PEP layer defining the first well 7.

In this embodiment, by the PEP for the second well formation step, while the opening portion 102 is formed in the photo-resist film 21, an opening portion 103 is formed in the photo-resist film 21 at a position corresponding to the alignment mark formation area 2. At this time, the first well formation area 3 and third well formation area 5 are entirely covered with the photo-resist film 21.

Figure 4:
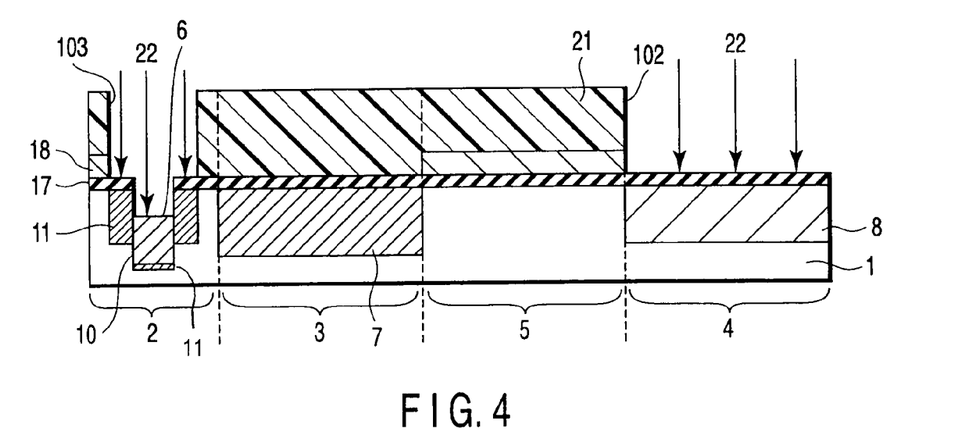

Then, as shown in FIG. 4, the substrate 1 is etched by an RIE method using conditions such that the etching rate of silicon oxide is high and the etching rate of poly-crystalline silicon is low. At this time, the silicon oxide film or pad oxide film 17 is exposed only within the opening 27 formed in the dummy poly-crystalline silicon film 19. Consequently, this exposed portion of the pad oxide film 17 is etched. Then, the substrate 1 is etched by an RIE method using conditions such that the etching rate of poly-crystalline silicon is high and the etching rate of silicon oxide is low. At this time, the portions of the dummy poly-crystalline silicon film 18 exposed within the opening portions 102 and 103 are etched. Further, the portion of the silicon substrate 1 exposed within the opening 27 is etched, so a first trench 6 is formed at a position corresponding to the alignment mark formation area 2. The first trench 6 needs to be deeper than a predetermined depth, so that a light exposure apparatus can detect it for a subsequent PEP. On the other hand, if the first trench 6 is too deep, it becomes difficult to fill the trench 6 with a photo-resist. In this embodiment, for example, the first trench 6 is set to have a depth of 0.02 to 0.15 μm.

Then, using the photo-resist film 21 as a mask, an impurity 22, such as boron, phosphorous, or arsenic, is ion-implanted. Consequently, a second well 8 is formed in the substrate 1 at a position corresponding to the second well formation area 4. Further, this impurity is introduced into the layer 10 and a portion around it, so a diffusion layer 11 is formed around the layer 10 in the substrate 1 at a position corresponding to the alignment mark formation area 2. This ion implantation is arranged to set the impurity peak at a position in the substrate 1, so that the dosage of the ion implantation is less uneven. Consequently, the impurity peak of the diffusion layer 11 is also formed in the substrate 1 at a position corresponding to the alignment mark formation area 2. If the second well 8 can be used with the same concentration as that in the silicon substrate 1, the well does not need to be formed deep, but may be formed shallower while being doped with an impurity, such as boron, phosphorous, or arsenic, for adjusting the threshold voltage (channel ion implantation).

Figure 5:
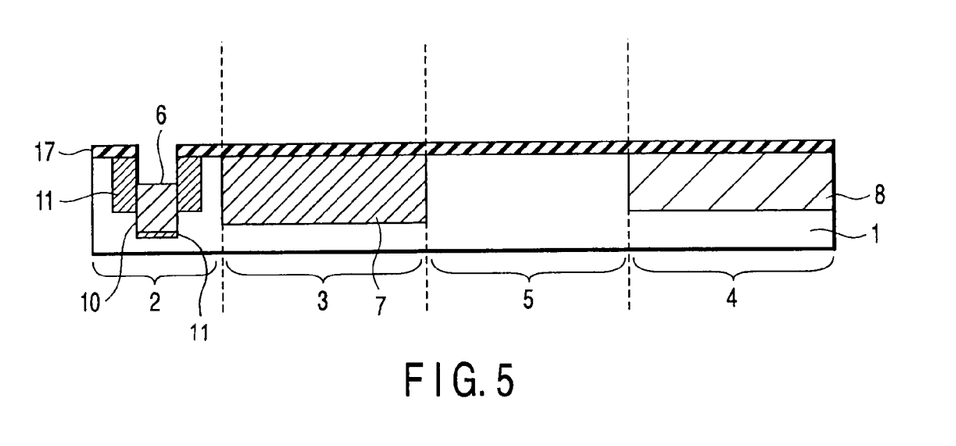

Then, as shown in FIG. 5, ashing of the photo-resist film 21 is performed, such that it is peeled off by, e.g., a mixture solution of sulfuric acid with hydrogen peroxide solution. Then, the dummy poly-crystalline silicon film 18 is removed. This removing may be performed by a blanket RIE method or CDE method using conditions such that the selectivity of poly-crystalline silicon is higher relative to silicon oxide. At this time, silicon is exposed in the first trench 6 within the mark formation area 2, and thus is etched. Where a blanket RIE method is used, the first trench 6 becomes deeper, because this is anisotropic etching. Where a CDE method is used, the first trench 6 becomes wider as well as becoming deeper, because this is isotropic etching. However, in the case of isotropic etching, the shape of the trench 6 is not deformed. In either of the methods, there is no problem arising for an alignment mark (ZL mark) or for the subsequent processes.

Figure 6:
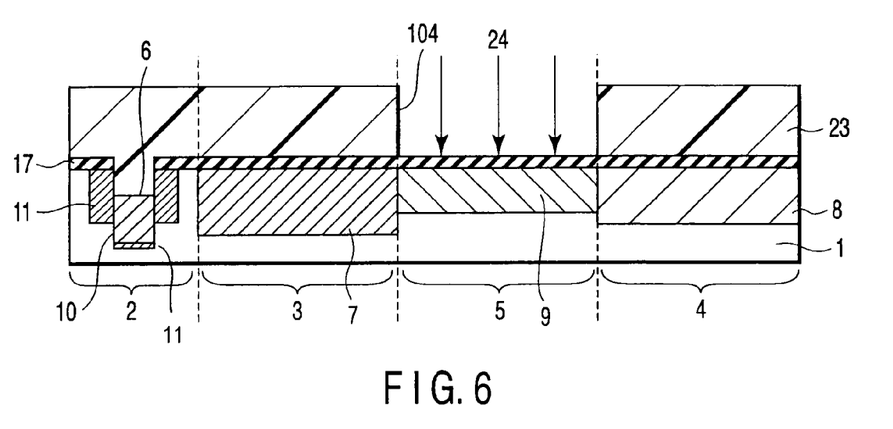

Then, as shown in FIG. 6, a photo-resist is applied onto the substrate 1 to form a photo-resist film 23. Then, an opening portion 104 is formed in the photo-resist film 23 by a photolithography method, at a position corresponding to a third well formation area 5. The opening portion 104 is used as a window to introduce an impurity for forming a third well. At this time, the first trench 6 is used as an alignment mark. For example, a light exposure apparatus detects the first trench 6, and thereby aligns the photo mask for forming the opening portion 104 with a predetermined position. Since the first trench 6 is formed in a self-alignment manner relative to the opening 27, the first trench 6 and first well 7 are defined by a common PEP layer. Consequently, when the PEP layer defining the third well 9 is formed, using the first trench 6 as an alignment mark, it is directly aligned with the PEP layer defining the first well 7.

Then, using the photo-resist film 23 as a mask, an impurity 24, such as phosphorous, is ion-implanted. Consequently, a third well 9 is formed in the substrate 1 at a position corresponding to the third well formation area 5.

Figure 7:
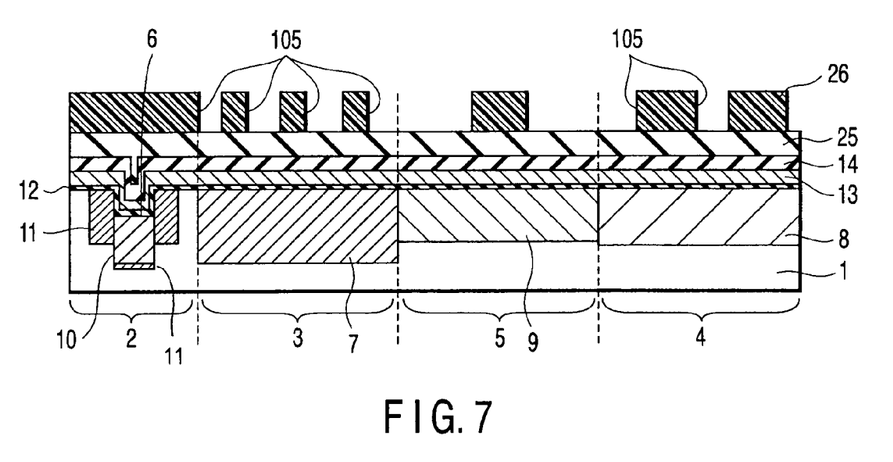

Then, as shown in FIG. 7, ashing of the photo-resist film 23 is performed, such that it is peeled off by, e.g., a mixture solution of sulfuric acid with hydrogen peroxide solution. At this time, annealing is performed at a temperature of, e.g., about 1,050° C. to activate the implanted impurities. The well formation steps are finished with this annealing step.

Then, an STI step is performed, which will be explained with reference to a sectional view of FIG. 7. At first, the pad oxide film 17 is peeled off by, e.g., ammonium fluoride aqueous solution. Then, the surface of the silicon substrate 1 is oxidized by, e.g., a thermal oxidation method to form a silicon oxide film 12 (which will be referred to as a gate oxide film, hereinafter) having a thickness of, e.g., about 10 nm on the silicon substrate 1. Then, poly-crystalline silicon is deposited by a CVD method to form a poly-crystalline silicon film 13 on the gate oxide film 12. Then, silicon nitride is deposited to form a silicon nitride film 14 on the poly-crystalline silicon film 13. Then, silicon oxide is deposited to form a silicon oxide film 25 on the silicon nitride film 13. The silicon oxide film 25 is to be used as a mask for etching the substrate 1.

Then, a photo-resist is applied onto the silicon oxide film 25 to form a photo-resist film 26. Then, an opening portion 105 is formed in the photo-resist film 26 by a photolithography method, at a position corresponding to an STI formation area. At this time, the first trench 6 is used as an alignment mark for positioning the photo mask. As described above, the first trench 6 and first well 7 are defined by a common PEP layer. Consequently, the PEP layer defining the STI is directly aligned with the PEP layer defining the first well 7.

Then, as shown in FIG. 1, using the photo-resist film 26 as a mask, the silicon oxide film 25 is subjected to anisotropic etching (RIE). Then, using the etched silicon oxide film 25 as a mask, the silicon nitride film 14, poly-crystalline silicon film 13, gate oxide film 12, and silicon substrate 1 are subjected to anisotropic etching (RIE) in this order to form second trenches 15. For example, the second trenches 15 are arranged such that the substrate 1 is etched by a depth of 0.15 μm or more. For example, this depth is selected to isolate two active areas having a voltage of 10V or more by an isolation width of 2 μm or less, wherein the voltage is used for data writing and data erasing in an EEPROM that utilizes an FN tunnel current.

Further, the impurity diffusion depth of the second well 8 is set such that the second well 8 is not divided by the second trenches 15, i.e., shallow trenches. Consequently, the well contact of the second well 8 is shared by a plurality of active areas, so that the circuit area of the second well 8 is decreased.

Similarly, the impurity diffusion depth of the first well 7 is set such that the first well 7 is not divided by the shallow trenches. Consequently, the well contact of the first well 7 is shared by a plurality of active areas, so that the circuit area of the first well 7 is decreased, as in the second well 8.

Similarly, the impurity diffusion depth of the third well 9 is set such that the third well 9 is not divided by the shallow trenches. Consequently, the well contact of third well 9 is shared by a plurality of active areas, so that the circuit area of third well 9 is decreased, as in the first and second wells 7 and 8. Then, the remaining silicon oxide film 2 is removed by HF or the like, and then silicon oxide is freshly deposited to form a silicon oxide film 16. Then, the surface of the silicon oxide film 16 is planarized by a CMP method to expose the silicon nitride film 14 in the active areas. The STI step is finished with this operation.

Figure 8:
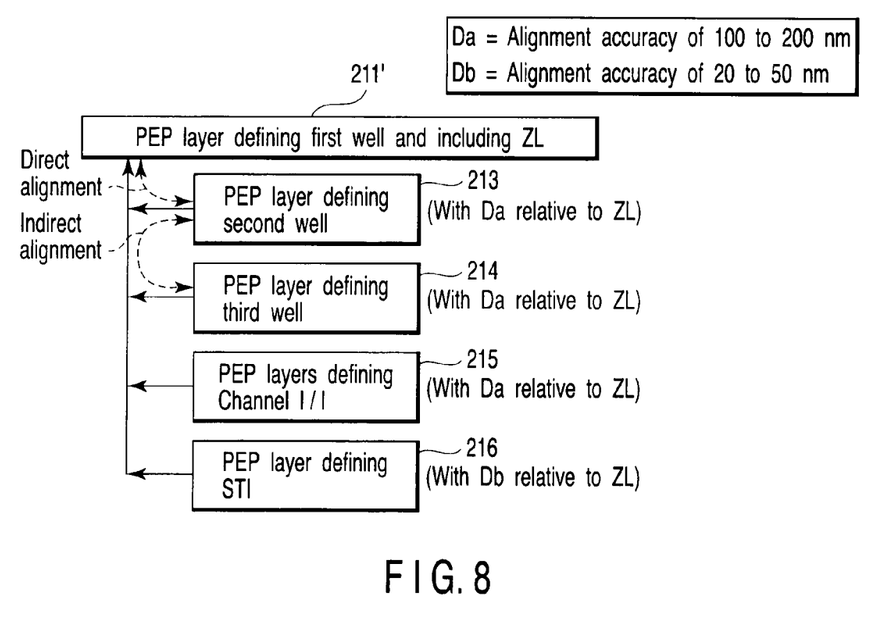
FIG. 8 is a view showing the alignment tree of a method of manufacturing the device according to the first embodiment of the present invention.
Figure 9:
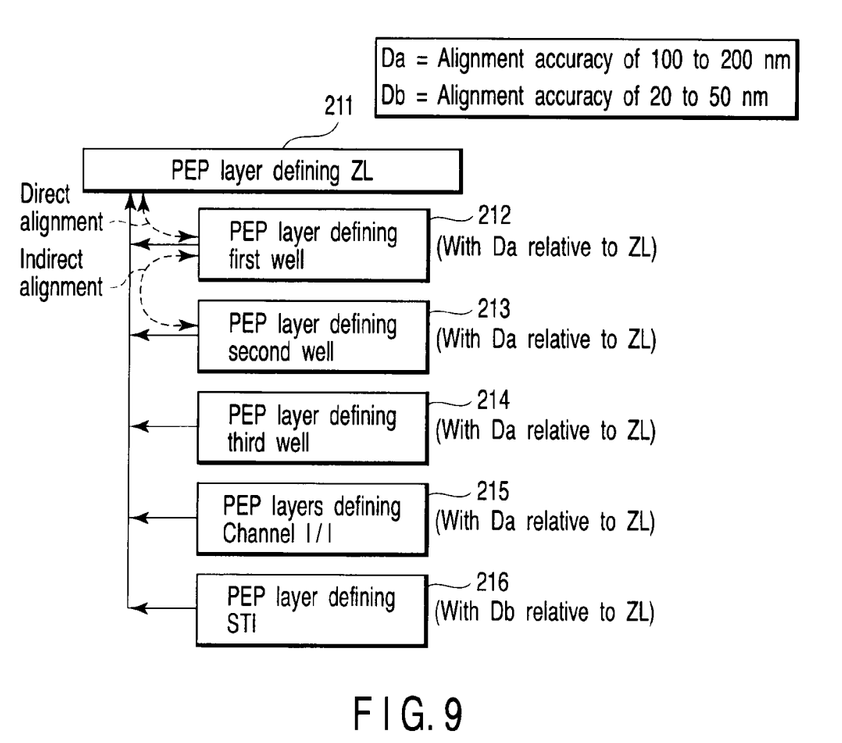
FIG. 9 is a view showing the alignment tree of a method of manufacturing a device according to a comparative example of the present invention.
Figure 10:
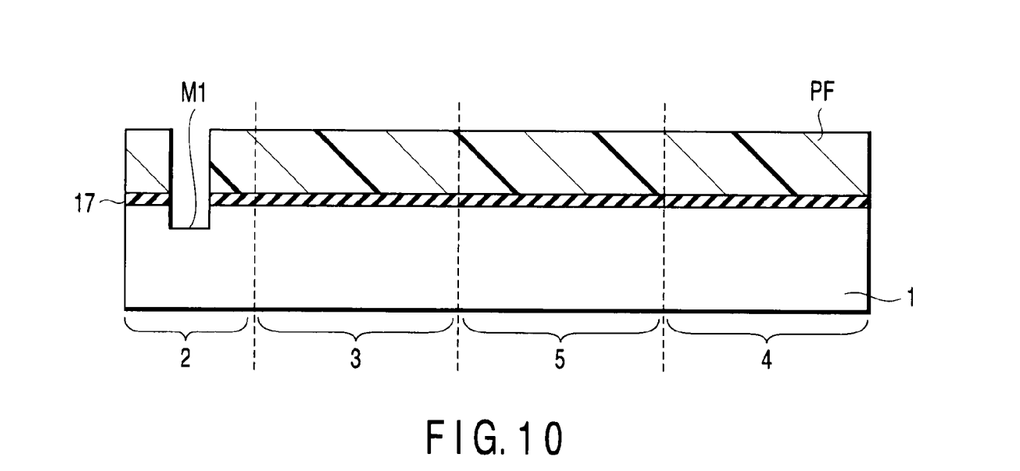
FIG. 10 is a sectional view showing an alignment mark used for a device according to a comparative example of the present invention.

FIG. 8 is a view showing the alignment tree of a method of manufacturing the device according to the first embodiment of the present invention. FIG. 9 is a view showing the alignment tree of a method of manufacturing a device according to a comparative example of the present invention. FIG. 10 is a sectional view showing an alignment mark used for a device according to a comparative example of the present invention. It should be noted that the alignment tree is intended to show the relationship in alignment between the respective PEP layers.

As shown in FIG. 9, in the comparative example, all the PEP layers up to the STI step are aligned with an alignment mark (ZL mark) formed before the well formation steps. In this respect, FIG. 10 shows a ZL mark M1 formed, using a photo-resist film PF. As shown in FIG. 10, the ZL mark M1 is formed in an alignment mark formation area 2 of a substrate 1 before the first to third wells are formed.

Specifically, as shown in FIG. 9, layers defining the first, second, and third wells (which will be referred to as first, second, and third well PEP layers, respectively, hereinafter) 212, 213, and 214 are aligned with a layer defining the ZL mark M1 (which will be referred to as a ZL mark PEP layer, hereinafter) 211. In other words, the first to third well PEP layers 212 to 214 are directly aligned with the ZL mark PEP layer 211. This alignment accuracy is expressed by Da.

Where there is a layer 215 for channel ion implantation (Channel I/I), this layer is also directly aligned with the ZL mark PEP layer 211. This alignment accuracy is also expressed by Da.

However, the alignment between the first well PEP layer 212 and second well PEP layer 213 is indirect alignment. Similarly, the alignment between the first well PEP layer 212 and third well PEP layer 214 is also indirect alignment. For example, the alignment accuracy of this indirect alignment is expressed by $(Da^2+Da^2)^{1/2}$, which is the square root of the sum of squares of Da. This comes to $Da \times \sqrt{2}$.

On the other hand, according to the first embodiment, the first well PEP layer 111' includes a ZL mark, and thus the ZL mark is defined by a PEP layer common to the first well. Accordingly, as shown in FIG. 8, the alignment between the first well PEP layer 111' and second well PEP layer 113 is direct alignment, unlike the comparative example. Similarly, the alignment between the first well PEP layer 111' and third well PEP layer 114 is also direct alignment. Consequently, this alignment accuracy is expressed by Da, which is improved from $Da \times \sqrt{2}$ of the comparative example.

Next, an explanation will be give of a specific example in relation to the alignment accuracy and improving effects thereon.

The PEPs for well formation steps are not required to use fine patterns, as compared with other PEPs, such as the PEP for an STI step. Accordingly, for example, a light exposure apparatus of an old model can be used for the PEPs for well formation steps. Where a light exposure apparatus of an old model is used, the alignment accuracy is within a range of, e.g., 100 to 200 nm (in the case of direct alignment).

On the other hand, the PEP for an STI step is required to use finer patterns, as compared with the PEPs for well formation steps, because, for example, memory cells need to be isolated at a minimum pitch. Further, it is necessary to ensure this memory cell isolation at a minimum pitch all over the light exposure face. For this purpose, for example, a light exposure apparatus of the most advanced model is used for the PEP for an STI step. Where a light exposure apparatus of the most advanced model is used, the alignment accuracy is within a range of, e.g., 20 to 50 nm (in the case of direct alignment). The former alignment accuracy is denoted by Da [nm], and the latter alignment accuracy is denoted by Db [nm]. For example, the former and latter satisfy a relationship of about $Da \geq 2Db$.

According to the first embodiment, the alignment between the second well PEP layer 213 and third well PEP layer 214 is indirect alignment. This alignment accuracy is expressed by $Da \times \sqrt{2}$. However, the alignment between the second well PEP layer 213 and first well PEP layer 211', and the alignment between the third well PEP layer 214 and first well PEP layer 211' are direct alignment. This alignment accuracy is expressed by Da. Where Da=150 nm is assumed, the alignment accuracy obtained by the first embodiment comes to 150 nm. On the other hand, the alignment accuracy obtained by the comparative example comes to $150\ nm \times \sqrt{2} \approx 212\ nm$.

As described above, as compared with the comparative example, the first embodiment provides an effect such that the alignment accuracy between the first well and each of the other wells is improved to be about 71% (=150 nm/212 nm) or less.

Further, in the comparative example, the alignment between a layer defining the STI (which will be referred to as an STI PEP layer, hereinafter) 216 and each of the first to third well PEP layers 213 to 215 is indirect alignment. This alignment accuracy is expressed by $(Da^2+Db^2)^{1/2}$, which is the square root of the sum of squares of Da [nm] and Db [nm].

Since the values Da and Db of alignment accuracy satisfy a relationship of Da≧2Db, as described above, this comes to $(Da^2+Db^2)^{1/2} \geq Db \times \sqrt{5}$ [nm].

On the other hand, according to the first embodiment, the STI PEP layer 216 is directly aligned with the first well PEP layer, and thus this alignment accuracy is Db [nm]. Accordingly, as compared with the comparative example, the first embodiment improves the alignment accuracy between the STI and first well to be about 45% ($=1/\sqrt{5}$) or less.

More specifically, where it is assumed that Db=30 nm and Da=150 nm, the alignment accuracy obtained by the first embodiment is 30 nm. On the other hand, the alignment accuracy obtained by the comparative example is $(150^2+30^2)^{1/2} \cong 153$ nm. In this specific example, as compared with the comparative example, the first embodiment improves the alignment accuracy between the STI and first well to be about 20% (=30 nm/153 nm).

Where the alignment accuracy is improved, the design rule for associated layers can be stricter, thereby advantageously decreasing the size of the chip. If it is not necessary to decrease the size of the chip, for example, the distance between memory cells and/or the distance between transistors can be relatively increased, thereby improving the inter-device breakdown voltage.

Further, the first embodiment does not require an independent step of forming an alignment mark, and thus the number of PEPs is decreased. Accordingly, the first embodiment is advantageous in terms of the manufacturing cost.

Incidentally, in the device according to the first embodiment, the trench 6 is left in the semiconductor substrate 1 as a trace of a photolithography alignment mark. Further, the diffusion layer 10 is formed in the semiconductor substrate 1 below the trench 6, such that it is doped with the same impurities as those contained in the first well 7 and second well 8. Furthermore, the diffusion layer 11 is formed around the diffusion layer 10, such that it is doped with the same impurity as that contained in the second well 8. These are traces of use of a manufacturing method according to the first embodiment. Accordingly, the first embodiment is intended to cover the structure of a semiconductor device manufactured by a method according to the first embodiment and thus including such traces.

Second Embodiment

Figure 11:
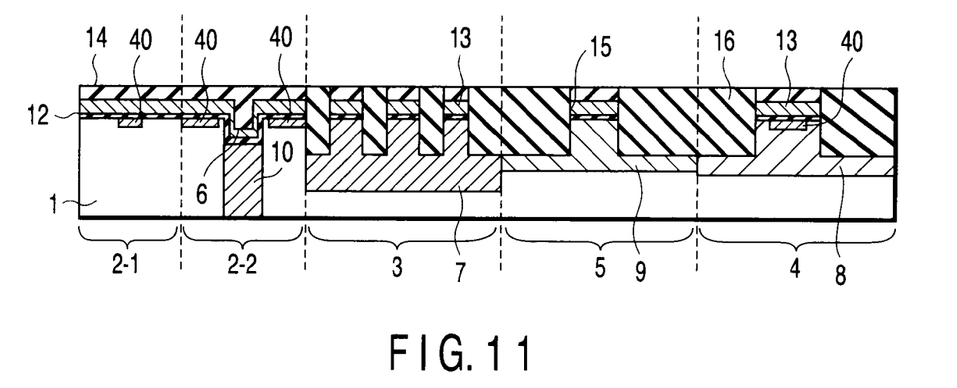
FIG. 11 is a sectional view showing a sectional structure of a semiconductor integration circuit device according to a second embodiment of the present invention, immediately after STI formation.

FIG. 11 is a sectional view showing a sectional structure of a semiconductor integration circuit device according to a second embodiment of the present invention, immediately after STI formation;

FIG. 11 is a sectional view showing a sectional structure of a semiconductor integration circuit device, such as a Flash EEPROM of the NAND type, according to a second embodiment of the present invention, immediately after STI formation.

As shown in FIG. 11, the second embodiment differs from the first embodiment in the following points. Otherwise, the second embodiment is the same as the first embodiment.

(1) There is a first alignment mark formation area 2-1 and a second alignment mark formation area 2-2.

(2) Around a first trench 6, there is formed a diffusion layer 10 doped with the same impurity as that contained in a first well 7, and a region 40 doped with the same impurity as that used for adjusting the threshold voltage of a transistor.

FIGS. 12 to 16 are sectional views showing steps, in order, of an exemplary method of manufacturing the device according to the second embodiment of the present invention.

Figure 12:
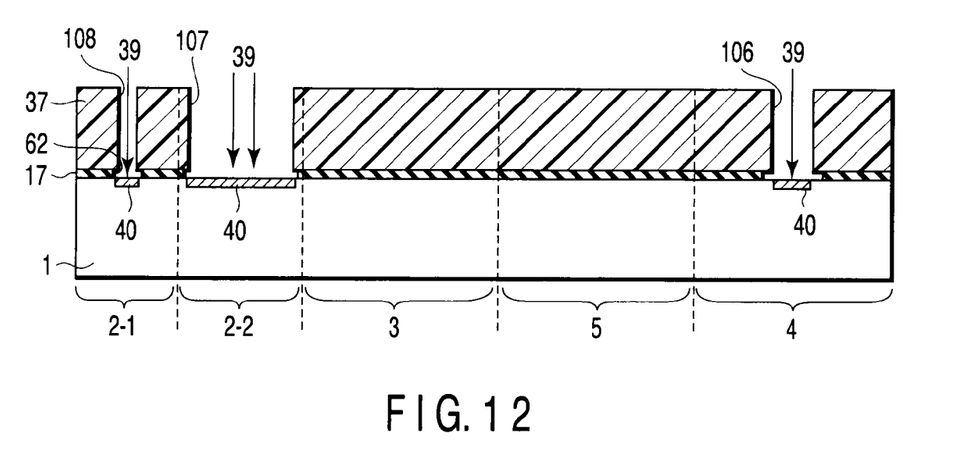
FIGS. 12, 13, 14, 15, and 16 are sectional views showing steps, in order, of an exemplary method of manufacturing the device according to the second embodiment of the present invention.

The method of manufacturing the device according to the second embodiment employs no dummy poly-crystalline silicon film 18 deposited for forming an alignment mark. Alternatively, before a first trench 6 used as an alignment mark is formed in a substrate 1, the PEP for a channel implantation step is performed, using a photo mask including an alignment mark different from the first trench 6, prior to formation of a first well 7. A detailed explanation will be given of this matter.

As shown in FIG. 12, a pad oxide film 17 is formed on the substrate 1, as in the first embodiment. In this embodiment, a mark usable as an alignment mark is to be formed in the pad oxide film 17. For this purpose, this pad oxide film 17 is thicker than the pad oxide film 17 of the first embodiment. For example, the pad oxide film 17 of the first embodiment has a thickness of about 10 nm, while the pad oxide film 17 of the second embodiment has a thickness of about 20 to 30 nm.

Then, a photo-resist is applied onto the pad oxide film 17 to form a photo-resist film 37. Then, an opening portion 108 is formed in the photo-resist film 37 by a photolithography method, at a position corresponding to a first alignment mark formation area 2-1. In this embodiment, at the same time, an opening portion 107 is further formed in the photo-resist film 37, at a position corresponding to a second alignment mark formation area 2-2. The opening portion 108 in the mark formation area 2-1 is set to have a predetermined shape for an alignment mark, such as a shape occupying a part of the mark formation area 2-1. On the other hand, for example, the opening portion 107 in the mark formation area 2-2 has a shape expanding all over the mark formation area 2-2. Furthermore, at the same time, an opening portion 106 is formed in the photo-resist film 37, at a position corresponding to a second well formation area 4. The opening portion 106 is used as a window to introduce an impurity for adjusting the threshold voltage of a transistor. In other words, this is a window for so-called channel ion implantation. The channel ion implantation is not necessary performed all over the formation area 8, but may be performed only on a predetermined necessary region.

Then, the portions of the pad oxide film 17 exposed within the opening portions 106, 107, and 108 are etched by, e.g., ammonium fluoride aqueous solution. At this time, a step or opening 62 is formed in the pad oxide film 17, at a position corresponding to the first alignment mark formation area 2-1. The opening 62 is usable as an alignment mark. Then, using the photo-resist film 37 as a mask, an impurity 39 is ion-implanted. The impurity 39 is used for adjusting the threshold voltage of a transistor, and comprising, e.g., boron, phosphorous, or arsenic. Consequently, channel ion implantation regions 40 are formed within the mark formation areas 2-1 and 2-2, and second well formation area 4.

Figure 13:
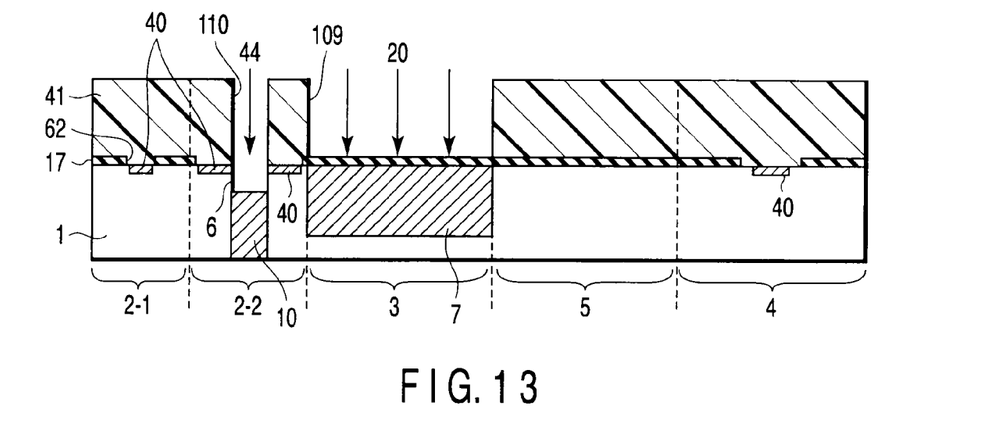

Then, as shown in FIG. 13, ashing of the photo-resist film 37 is performed, such that it is peeled off by, e.g., a mixture solution of sulfuric acid with hydrogen peroxide solution. Then, a photo-resist is applied onto the substrate 1 to form a photo-resist film 41. Then, an opening portion 109 is formed in the photo-resist film 41 by a photolithography method, at a position corresponding to a first well formation area 3. At this time, an opening portion 110 is further formed in the photo-resist film 41 at a position corresponding to the mark formation area 2-2. Accordingly, the mask pattern drawn on the photo mask used at this time, which is transferred onto the photo-resist film 41, includes both a first well formation pattern and an alignment mark formation pattern. At this time, the first alignment mark formation area 2-1, second well formation area 4, and third well formation area are entirely covered with the photo-resist film 41. This photolithography is performed, using the opening 62 as an alignment mark. For example, a light exposure apparatus detects the opening 62, and thereby aligns the photo mask for forming the opening portions 109 and 110 with a predetermined position.

Since the opening 62 and the opening portion 106 for channel ion implantation are formed by the same PEP, the opening 62 and channel ion implantation region are defined by a common PEP layer. Consequently, the PEP layer defining the first well 7 is directly aligned with the PEP layer for the channel ion implantation. Then, the portion of the substrate 1 exposed within the opening portion 110 is etched by, e.g., an RIE method using conditions such that the etching rate of silicon is high and the etching rate of silicon oxide is low. Consequently, the portion of the silicon substrate 1 exposed within second alignment mark formation area 2-2 is etched, so a first trench 6 is formed. On the other hand, in the first well formation area 3, the pad oxide film 17 serves as an etching stopper, and thus no trench is formed here. The first trench 6 is used as an alignment mark for PEPs from this step to an STI step. For example, the first trench 6 is set to have a depth of 0.02 to 0.15 µm, for the reason described in the first embodiment.

Then, using the photo-resist film 41 as a mask, an impurity 20, such as boron, is ion-implanted. Consequently, a first well 7 is formed in the substrate 1 at a position corresponding to the first well formation area 3. Further, ions are implanted into the portion of the substrate 1 exposed at the bottom of the first trench, and a diffusion layer 10 is thereby formed. This ion implantation is arranged to set the impurity peak at a position in the substrate 1, so that the dosage of the ion implantation is less uneven. Consequently, the impurity peak of the diffusion layer 10 is also formed in the substrate 1 at a position corresponding to the bottom of the first trench 6.

Figure 14:
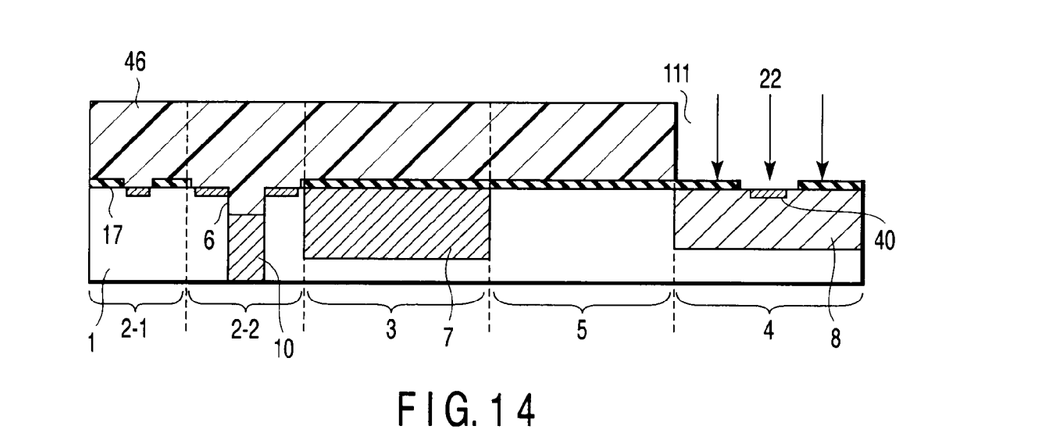

Then, as shown in FIG. 14, ashing of the photo-resist film 41 is performed, such that it is peeled off by, e.g., a mixture solution of sulfuric acid with hydrogen peroxide solution. Then, a photo-resist is applied onto the substrate 1 to form a photo-resist film 46. Then, an opening portion 111 is formed in the photo-resist film 46 by a photolithography method, at a position corresponding to a second well formation area 4. The opening portion 111 is used as a window to introduce an impurity for forming a second well. At this time, the first trench 6 formed in the substrate 1 is used as an alignment mark. For example, a light exposure apparatus detects the first trench 6, and thereby aligns the photo mask for forming the opening portion 111 with a predetermined position. The first trench 6 and first well 7 are defined by a common PEP layer. Consequently, the PEP layer defining the second well 8 is directly aligned with the PEP layer defining the first well 7.

Then, using the photo-resist film 46 as a mask, an impurity 22, such as boron, phosphorous, or arsenic, is ion-implanted. Consequently, a second well 8 is formed in the substrate 1 at a position corresponding to the second well formation area 4. If the second well 8 can be used with the same concentration as that in the silicon substrate 1, the well may be not formed.

Figure 15:
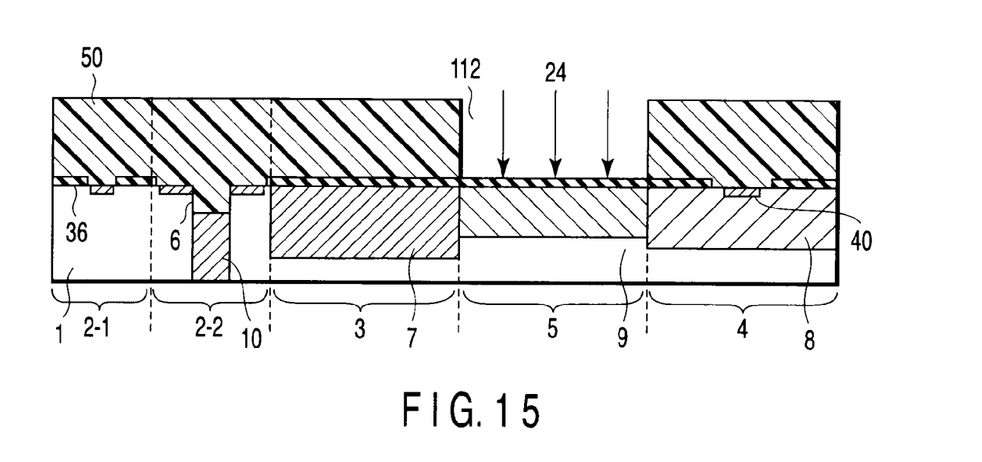

Then, as shown in FIG. 15, ashing of the photo-resist film 46 is performed, such that it is peeled off by, e.g., a mixture solution of sulfuric acid with hydrogen peroxide solution. Then, a photo-resist is applied onto the substrate 1 to form a photo-resist film 50. Then, an opening portion 112 is formed in the photo-resist film 50 by a photolithography method, at a position corresponding to a third well formation area 5. The opening portion 112 is used as a window to introduce an impurity for forming a third well. At this time, the first trench 6 is used as an alignment mark. For example, a light exposure apparatus detects the first trench 6, and thereby aligns the photo mask for forming the opening portion 112 with a predetermined position. The first trench 6 and first well 7 are defined by a common PEP layer. Consequently, the PEP layer defining the third well 9 is directly aligned with the PEP layer defining the first well 7.

Then, using the photo-resist film 50 as a mask, an impurity 24, such as phosphorous, is ion-implanted. Consequently, a third well 9 is formed in the substrate 1 at a position corresponding to the third well formation area 5.

Figure 16:
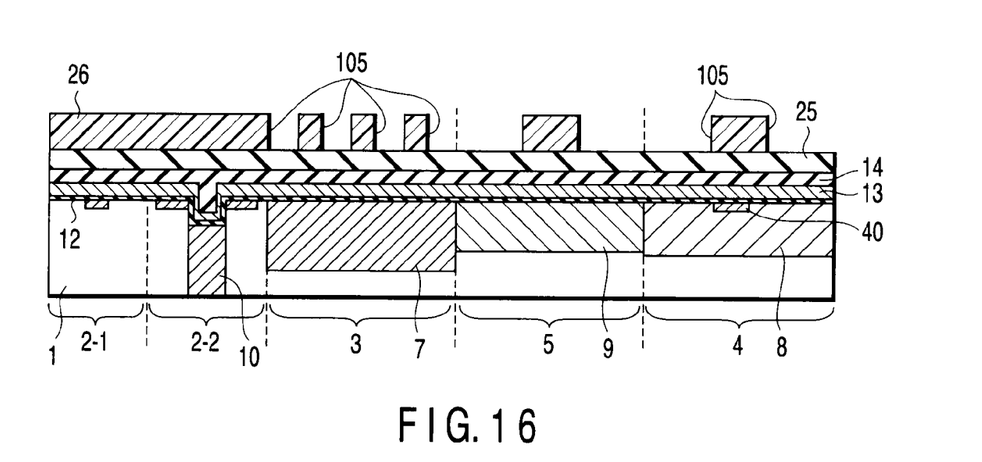

Then, as shown in FIG. 16, ashing of the photo-resist film 50 is performed, such that it is peeled off by, e.g., a mixture solution of sulfuric acid with hydrogen peroxide solution. At this time, annealing is performed at a temperature of, e.g., about 1,050° C. to activate the implanted impurities. The well formation steps are finished with this annealing step, also in the second embodiment.

Then, an STI step is performed, which will be explained with reference to a sectional view of FIG. 16. At first, the pad oxide film 17 is peeled off by, e.g., ammonium fluoride aqueous solution, as in the first embodiment. Then, a gate oxide film 12, a poly-crystalline silicon film 13, a silicon nitride film 14, and a silicon oxide film 25 are formed in this order, as in the first embodiment.

Then, a photo-resist is applied onto the silicon oxide film 25 to form a photo-resist film 26. Then, an opening portion 105 is formed in the photo-resist film 26 by a photolithography method, at a position corresponding to an STI formation area. At this time, the first trench 6 is used as an alignment mark for positioning the photo mask. As described above, the first trench 6 and first well 7 are defined by a common PEP layer. Consequently, the PEP layer defining the STI is directly aligned with the PEP layer defining the first well 7. Then, the same steps as those of the first embodiment are subsequently performed to obtain the structure shown in FIG. 11.

Figure 17:
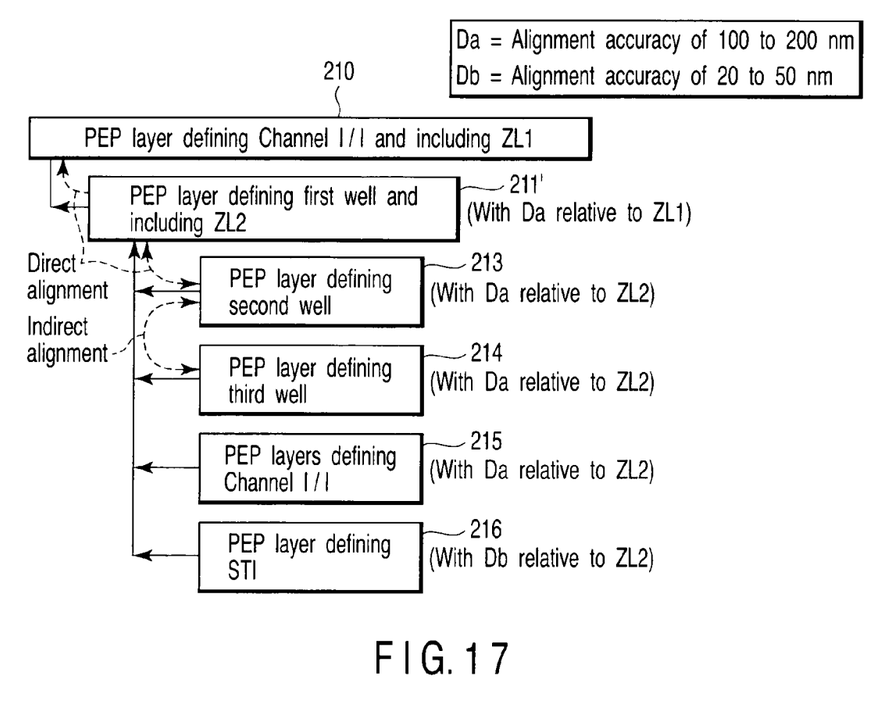
FIG. 17 is a view showing the alignment tree of a method of manufacturing the device according to the second embodiment of the present invention.

FIG. 17 is a view showing the alignment tree of a method of manufacturing the device according to the second embodiment of the present invention.

In the comparative example shown in FIG. 9, each of the PEP layers up to the STI steps is aligned with the PEP layer defining the first trench initially formed, i.e., the ZL mark PEP layer.

On the other hand, according to the second embodiment, as shown in FIG. 17, the PEP layer 210 for channel ion implantation includes a ZL mark, and thus this ZL mark is defined by a PEP layer common to the channel ion implantation. Further, the PEP layer 211' defining the first well includes another ZL mark, and thus this ZL mark is defined by a PEP layer common to the first well.

The alignment tree shown in FIG. 17 may seem to include an additional step formed of the first channel ion implantation, and thus to include an increased number of processing steps. However, this is not true. Although no explanation is given in the first embodiment, an actual manufacturing method includes a plurality of channel ion implantation steps respectively after well formation steps. The second embodiment is arranged to perform only one of the channel ion implantation steps at first as the first channel ion implantation step. Accordingly, the number of processing steps is not increased. For this purpose, in the second embodiment, the PEP layer 210 defining the first channel ion implantation includes an alignment mark (ZL mark). In other words, the second embodiment includes no step of forming only an alignment mark (ZL mark), as in the first embodiment. Consequently, as compared with the comparative example including a step of forming only an alignment mark (see FIGS. 9 and 10), the second embodiment can decreases some of the processing steps, such as a photolithography step and an etching step.

Also in the second embodiment, the alignment between the first well PEP layer 211' and second well PEP layer 213, and the alignment between the first well PEP layer 211' and third well PEP layer 214 are direct alignment. Similarly, the alignment between the first well PEP layer 211' and STI PEP layer 216 is also direct alignment. Similarly, the alignment between the first well PEP layer 211' and channel ion implantation PEP layer 215 except for the first channel ion implantation PEP layer is also direct alignment. Consequently, the second embodiment provides the same effects as those of the first embodiment.

Incidentally, in the device according to the second embodiment, the region 40 is formed in the semiconductor substrate 1 as a trace of the first alignment mark 62 for photolithography, such that it is doped with the same impurity as that used for adjusting the threshold voltage of a channel region. Further, the trench 6 is left in the semiconductor substrate 1 as a trace of the second alignment mark for photolithography. Further, the diffusion layer 10 is formed in the semiconductor substrate 1 below the trench 6, such that it is doped with the same impurity as that contained in the first well 7. These are traces of use of a manufacturing method according to the second embodiment. Accordingly, the second embodiment is intended to cover the structure of a semiconductor device manufactured by a method according to the second embodiment and thus including such traces.

(Matters Common to First and Second Embodiments)

The embodiments described above includes no step of forming only an alignment mark (ZL step), which is conventionally performed at first in the process. Alternatively, a pattern usable as an alignment mark is included in a photo mask used for the PEP for a well formation step or a photo mask used for the PEP for a channel ion implantation step. Then, a mark usable as an alignment mark is formed in a substrate surface. Consequently, the number of processing steps is decreased, and thereby suppressing an increase in the manufacturing cost.

Further, a mark usable as an alignment mark is obtained by a well formation step or channel ion implantation step. Consequently, the alignment between the wells and the alignment between the well and STI are changed from indirect alignment to direct alignment. Further, the alignment between the well and region for introducing an impurity for adjusting the threshold voltage is changed from indirect alignment to direct alignment. Where the alignment between some of the PEP layers is changed from indirect alignment to direct alignment like this, the size of the chip can be decreased more easily.

At a portion where the alignment is changed to direct alignment, the design rule for associated PEP layers can be stricter, thereby advantageously decreasing the size of the chip. If it is not necessary to decrease the size of the chip, for example, the distance between wells can be increased, thereby improving the inter-device breakdown voltage.

The embodiments described above are exemplified by a case where the present invention is applied to a Flash memory of the NAND type. However, the present invention is not limited to a Flash memory of the NAND type, and it may be applied to a Flash memory of the AND type or NOR type, other than the NAND type. Further, the present invention is not limited to a Flash memory, and it may be applied to a semiconductor device of another type selected from various types.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

covering a surface of a substrate structure including a semiconductor layer with a first film including first and second openings, the first opening being configured as an alignment mark, and the second opening being configured as an opening for introducing an impurity into a first predetermined position of the semiconductor layer;

introducing a first impurity into the semiconductor layer through the second opening;

covering a surface of the first film including the first and second openings with a second film;

forming a third opening in the second film while aligned with the first opening used as an alignment mark, the third opening being configured as an opening for introducing an impurity into a second predetermined position of the semiconductor layer; forming a trench in the semiconductor layer through an additional opening formed in the first film along with the first and second openings; and introducing a second impurity into the semiconductor layer through the third opening.

2. The method according to claim 1, wherein the first film is an insulative film and the second impurity is introduced into the semiconductor layer through the first film.

3. The method according to claim 1, wherein the second opening is configured as an opening for introducing the first impurity, as an impurity for adjusting a threshold voltage, into a channel region of a transistor to be formed on the semiconductor layer.

4. The method according to claim 1, wherein the third opening is configured as an opening for introducing the second impurity to form a first well within a first active area of the semiconductor layer.

5. The method according to claim 1, wherein the method further comprises:

after removal of the first film, forming a device isolation area in the semiconductor layer while using a photo mask aligned with the trench used as an alignment mark.

6. The method according to claim 5, wherein, after removal of the second film and before formation of the device isolation area, the method further comprises:

covering a surface of the first film including the first and second openings and the additional opening with a third film;

forming a fourth opening in the third film while using a photo mask aligned with the first opening or the trench used as an alignment mark, the fourth opening being configured as an opening for introducing an impurity into a third predetermined position of the semiconductor layer; and introducing a third impurity into the semiconductor layer through the fourth opening.

7. The method according to claim 6, wherein the fourth opening is configured as an opening for introducing the third impurity to form a well within an active area of the semiconductor layer.

8. The method according to claim 5, wherein the method further comprises:
introducing the first impurity into the semiconductor layer through the first opening at substantially the same time as introducing the first impurity into the semiconductor layer through the second opening; and
introducing the second impurity into the semiconductor layer through the trench at substantially the same time as introducing the second impurity into the semiconductor layer through the third opening.

9. The method according to claim 5, wherein the trench is set to have a depth of 0.02 to 0.15 μm.

* * * * *